(12) United States Patent
Fukunaga et al.

(10) Patent No.: US 8,415,557 B2
(45) Date of Patent: Apr. 9, 2013

(54) PHOTOELECTRIC CONVERSION DEVICE AND SOLAR CELL USING THE PHOTOELECTRIC CONVERSION DEVICE

(75) Inventors: Toshiaki Fukunaga, Ashigarakami-gun (JP); Atsushi Mukai, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 370 days.

(21) Appl. No.: 12/718,611

(22) Filed: Mar. 5, 2010

(65) Prior Publication Data

US 2010/0224249 A1 Sep. 9, 2010

(30) Foreign Application Priority Data

Mar. 9, 2009 (JP) ................. 2009-054745

(51) Int. Cl.
*H01L 31/00* (2006.01)
(52) U.S. Cl.
USPC ........................... 136/260; 136/262; 136/264
(58) Field of Classification Search .................. 136/260, 136/262, 264
See application file for complete search history.

(56) References Cited

U.S. PATENT DOCUMENTS

| | | | |
|---|---|---|---|
| 4,734,168 A * | 3/1988 | Bockris et al. ................. 438/658 |
| 4,798,660 A * | 1/1989 | Ermer et al. ............. 204/192.17 |
| 5,626,688 A | 5/1997 | Probst et al. |
| 5,994,163 A | 11/1999 | Bodegard et al. |
| 2003/0121542 A1 | 7/2003 | Harneit et al. |
| 2005/0028861 A1* | 2/2005 | Aoki et al. ..................... 136/256 |
| 2005/0056863 A1 | 3/2005 | Negami et al. |
| 2005/0074915 A1* | 4/2005 | Tuttle et al. ...................... 438/57 |
| 2006/0220059 A1 | 10/2006 | Satoh et al. |

FOREIGN PATENT DOCUMENTS

| | | |
|---|---|---|
| JP | 4022577 B2 | 8/1996 |
| JP | 09-055378 A | 2/1997 |
| JP | 09-074065 A | 3/1997 |
| JP | 09-074213 A | 3/1997 |
| JP | 10-074966 A | 3/1998 |
| JP | 10-074967 A | 3/1998 |
| JP | 10-125941 A | 5/1998 |
| JP | 2000-349320 A | 12/2000 |
| JP | 2003529938 A | 10/2003 |

(Continued)

OTHER PUBLICATIONS

Yun, J. et al., Proc. 4th World Conf. PV Energy Conversion, p. 509 IEEE, 2006.*

(Continued)

*Primary Examiner* — Keith Hendricks
*Assistant Examiner* — Eli Mekhlin
(74) *Attorney, Agent, or Firm* — Sughrue Mion, PLLC

(57) ABSTRACT

A photoelectric conversion device having a laminated structure includes: an anodized substrate constituted by a metal substrate mainly containing aluminum and an anodized film formed on the metal substrate; a lower electrode mainly containing molybdenum; a semiconductor photoelectric conversion layer generating current when absorbing light; an upper electrode; a metal supply layer being formed in contact with or inside the lower electrode, containing an alkali and/or alkaline earth metal element, and supplying the alkali and/or alkaline earth metal element to the photoelectric conversion layer during formation of the photoelectric conversion layer; and a diffusion barrier layer being conductive and formed between the anodized substrate and the metal supply layer in contact with the lower electrode and/or the metal supply layer or inside the lower electrode, and suppressing diffusion, into the anodized substrate, of the alkali and/or alkaline earth metal element from the metal supply layer.

9 Claims, 4 Drawing Sheets

FOREIGN PATENT DOCUMENTS

| | | | |
|---|---|---|---|
| JP | 2003-318424 A | 11/2003 | |
| JP | 2004-079858 A | 3/2004 | |
| JP | 2004-158556 A | 6/2004 | |
| JP | 2005-086167 A | 3/2005 | |
| JP | 2006-210424 A | 8/2006 | |
| JP | 2006210424 A | * | 8/2006 |
| JP | 2007266626 A | 10/2007 | |
| JP | 2009505430 A | 2/2009 | |
| WO | 03007386 A1 | 1/2003 | |

OTHER PUBLICATIONS

Aluminum Handbook (in Japanese), 4th edition, Japan Light Metal Association, 1990, pp. 1-5 and 219-221.

J.R. Tuttle, et al., "The Performance of Cu(In,Ga)Se$_2$-Based Solar Cells in Conventional and Concentrator Applications", Material Research Society (MRS) Symposium Proceedings, 1996, pp. 143-151, vol. 426.

L. Stolt, et al., "Thin Film Solar Cell Modules Based on Cu(In,Ga)SE$_2$ Prepared by the Coevaporation Method", Proceedings of the 13th European Photovoltaic Solar Energy Conference, 1995, pp. 1451-1455.

H. Miyazaki, et al., "Growth of high-quality CuGaSe$_2$ thin films using ionized Ga precursor", Phys. Stat. Sol.(a) 2006, pp. 2603-2608, vol. 203, No. 11.

M. Kawamura, et al., "Growth of Cu(In$_{1-x}$Ga$_x$)Se$_2$ thin films using cracked selenium", Proceedings of the 68th Autumn Meeting of the Japan Society of Applied Physics (held at Hokkaido Institute of Technology in 2007), Lecture No. 7p-L-6.

S. Ishizuka, et al., "Preparation of Cu(In$_{1-x}$Ga$_x$)Se$_2$ thin films using a Se-radical beam source and solar cell performance", Proceedings of the 54th Spring Meeting of the Japan Society of Applied Physics (held at Aoyama Gakuin University in 2007), Lecture No. 29p-ZW-10.

Y. Ishii, et al., "High Quality CIGS Thin Films and Devices by Photo-Excited Deposition Process", in the Proceedings of the 54th Spring Meeting of the Japan Society of Applied Physics (held at Aoyama Gakuin University in 2007), Lecture No. 29p-ZW-14.

T. Nakada, et al., "CuInSe$_2$-based solar cells by Se-vapor selenization from Se-containing precursors", Solar Energy Materials and Solar Cells, 1994, pp. 209-214, vol. 35.

T. Nakada, et al., "Thin Films of CuInSe$_2$ Produced by Thermal Annealing of Multilayers With Ultra-Thin Stacked Elemental Layers", Proceedings of the 10th European Photovoltaic Solar Energy Conference (EU PVSEC), 1991, pp. 887-890.

K. Kushiya, et al., "Fabrication of graded band-gap Cu(InGa)Se$_2$ thin-film mini-modules with a Zn(O,S,OH)$_x$ buffer layer", Solar Energy Materials and Solar Cells, 1997, pp. 277-283, vol. 49.

J.H. Ermer, et al., "CdS/CuInSe$_2$ Junctions Fabricated by DC Magnetron Sputtering of Cu$_2$Se and In$_2$Se$_3$", Proceedings of the 18th IEEE Photovoltaic Specialists Conference, 1985, pp. 1655-1658.

T. Nakada, et al., "Polycrystalline CuInSe$_2$ Thin Films for Solar Cells by Three-Source Magnetron Sputtering", Japanese Journal of Applied Physics, 1993, pp. L1169-L1172, vol. 32, Part 2, No. 8B.

T. Nakada, et al., "Microstructural Characterization for Sputter-Deposited CuInSe$_2$ Films and Photovoltaic Devices", Japanese Journal of Applied Physics, 1995, pp. 4715-4721, vol. 34, Part 1, No. 9A.

T. Wada, et al., "Fabrication of Cu(In,Ga)Se$_2$ thin films by a combination of mechanochemical and screen-printing/sintering processes", Physica status solidi (a), 2006, pp. 2593-2597, vol. 203, No. 11.

T. Dullweber, et al., "A new approach to high-efficiency solar cells by band gap grading in Cu(In,Ga)Se$_2$ chalcopyrite semiconductors", Solar Energy Materials and Solar Cells, 2001, pp. 145-150, vol. 67.

"Butsuri Data Jiten (Physical Data Book, in Japanese)," The Physical Society of Japan (ed.), Asakura Publishing, 2006, pp. 161-163.

Japanese Office Action for Application No. 2009-054745; Jun. 12, 2012.

Implications of Modified Simplified Hybrid Process on Cigs Devices and Minimodules; Sahoo, et al., IEEE 978-1-4244-1641; Jul. 2008.

* cited by examiner

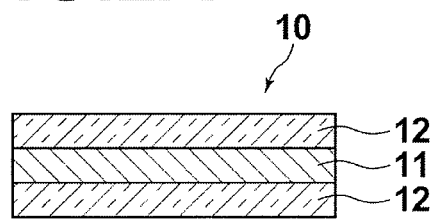
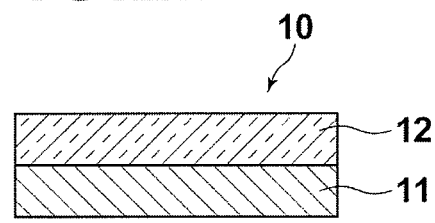
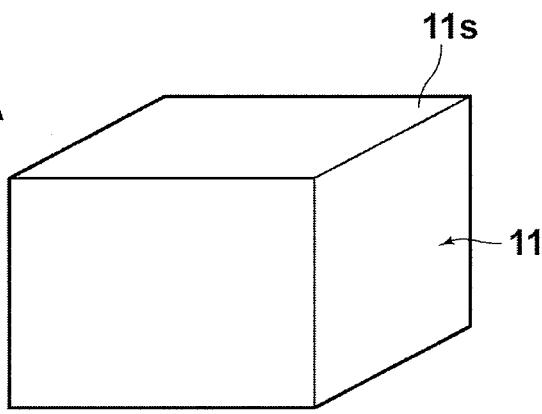
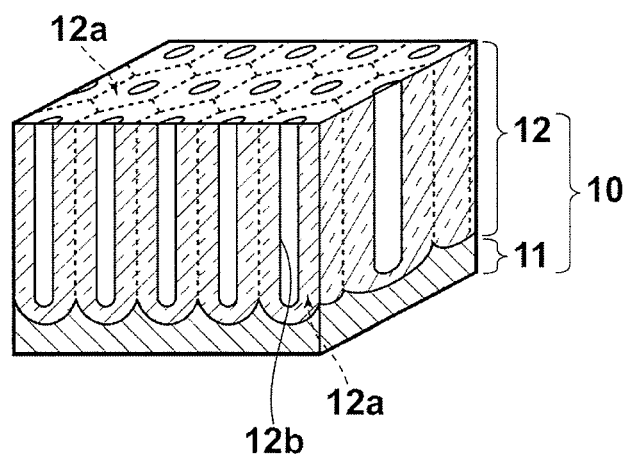

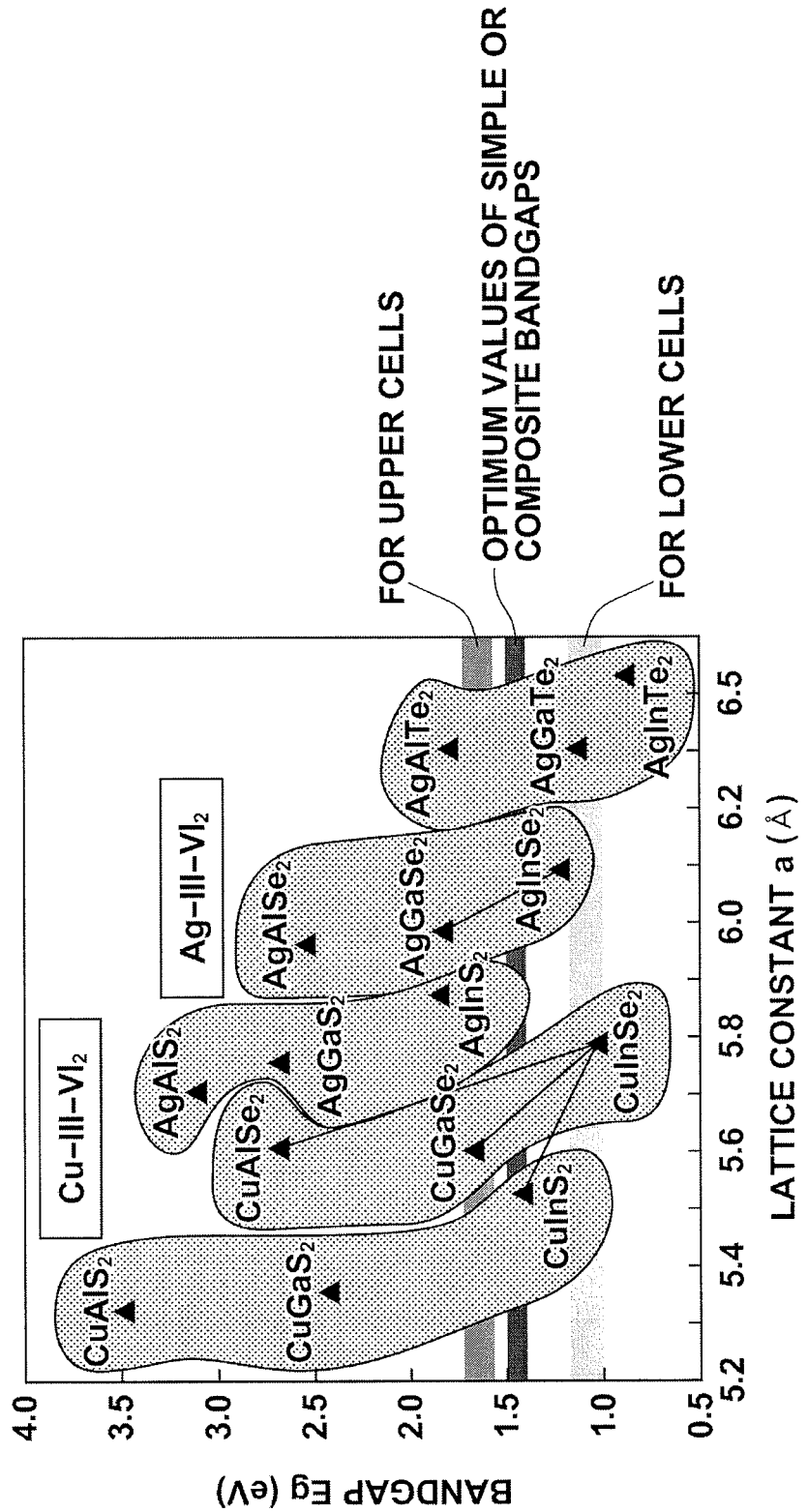

PHOTOELECTRIC CONVERSION DEVICE AND SOLAR CELL USING THE PHOTOELECTRIC CONVERSION DEVICE

BACKGROUND OF THE INVENTION

1. Field of the Invention

The present invention relates to a photoelectric conversion device having on an anodized substrate a laminated structure constituted by a lower electrode, a photoelectric semiconductor layer, and an upper electrode. The present invention also relates to a solar cell using such a photoelectric conversion device.

2. Description of the Related Art

Currently, photoelectric conversion devices having a laminated structure constituted by a lower (underside) electrode, a photoelectric semiconductor layer, and an upper electrode are used in various applications including the solar cell. The photoelectric semiconductor layer generates electric current when the photoelectric semiconductor layer absorbs light.

Conventionally, the Si-based solar cell using bulk monocrystalline Si, bulk polycrystalline Si, or thin-film amorphous Si have been the mainstream of the solar cells. However, research and development semiconductor compound-based solar cells not using silicon are proceeding. The currently known semiconductor compound-based solar cells include the bulk type solar cells such as the GaAs-based solar cells and the thin-film type solar cells such as the CIS (Cu—In—Se)-based or CIGS (Cu—In—Ga—Se)-based solar cells. The CIS-based or CIGS-based solar cells use semiconductor compounds composed of a Group Ib element, one or more Group IIIb elements, and a Group VIb element, and are reported to exhibit high optical absorptance and high energy conversion efficiency. In this specification, the numbering of the groups of elements is in accordance with the short-period form of the periodic table.

Although, currently, the glass substrate is mainly used as the substrate in the solar cell, use of a flexible metal substrate is being considered. In the case where a metal substrate is used, it is necessary to form an insulation film on a surface of the substrate for preventing short circuiting between the substrate and an electrode or a photoelectric conversion layer formed over the substrate.

In order to suppress warpage and the like caused by thermal stress, it is preferable that the difference in the thermal expansion coefficient between the substrate and each layer formed above the substrate be small. Further, from the viewpoints of the difference in the thermal expansion coefficient between the substrate and each of the photoelectric conversion layer and the lower electrode, the cost, the characteristics necessary for the solar cell, and the like, it is preferable that the metal substrate contain aluminum as a main component.

Japanese Unexamined Patent Publication No. 2000-349320 (which is hereinafter referred to as JP2000-349320A) proposes use of an anodized substrate, which is produced by forming an anodized ($Al_2O_3$) film on an Al substrate. (See claim 9 in JP2000-349320A.) According to the technique disclosed in JP2000-349320A, even in the case where the area of the substrate is large, it is possible to easily form an insulation film over the entire surface of the substrate without a pinhole.

It is known that the crystallinity and the photoelectric conversion efficiency of the photoelectric conversion layers in the photoelectric conversion devices such as the CIS-based and CIGS-based photoelectric conversion devices can be improved by diffusing an alkali metal element or an alkaline earth metal element (preferably sodium) into the photoelectric conversion layers. Conventionally, sodium is diffused into the photoelectric conversion layers by using a substrate of soda lime glass (which contains sodium).

In the case where the anodized substrate disclosed in JP2000-349320A is used, the substrate contains neither the alkali metal element nor the alkaline earth metal element. Therefore, Japanese Unexamined Patent Publication Nos. 10 (1998)-074966, 10 (1998)-074967, 9 (1997)-055378 and 10 (1998)-125941, U.S. Patent Application Publication No. 20050056863, Japanese Unexamined Patent Publication Nos. 2006-210424, 2003-318424 and 2005-086167, U.S. Pat. No. 5,626,688, Japanese Unexamined Patent Publication Nos. 2004-158556 and 2004-079858, and U.S. Pat. No. 5,994,163 propose arrangement of a layer supplying an alkali metal element between a substrate and a photoelectric conversion layer. For example, arrangement of an alkali-metal supply layer on a lower electrode of molybdenum is proposed.

Nevertheless, even in the case where the alkali-metal supply layer is simply arranged between a substrate and a photoelectric conversion layer, it is difficult to diffuse the alkali metal element into the photoelectric conversion layer with satisfactory stability, efficiency, and repeatability, since the alkali metal element in the alkali-metal supply layer is diffused into the substrate in processes before formation of the photoelectric conversion layer. In addition, when an alkali metal element such as sodium is diffused into the anodized film, the anodized film can deteriorate, so that distortion of the photoelectric conversion device can increase after the formation of the photoelectric conversion layer, and microcracking or film exfoliation can occur in the photoelectric conversion layer.

Japanese Patent No. 4022577 (which is hereinafter referred to as JP4022577) discloses a process for producing a photoelectric conversion device using a glass substrate. In the process, a photoelectric conversion layer is doped with an alkali metal element before or during formation of the photoelectric conversion layer, and a diffusion barrier layer is arranged between a substrate and the photoelectric conversion layer for suppressing additional diffusion of the alkali metal element from the substrate to the photoelectric conversion layer during the process. (See claim 1 in JP4022577.) Further, JP4022577 discloses as a preferable diffusion barrier layer an insulating diffusion barrier layer formed of one of $Al_2O_3$, $SiO_2$, $Si_3N_4$, $ZrO_2$, and $TiO_2$ (in claim 8 of JP4022577), and a conductive diffusion barrier layer formed of one of TiN, Pt, and Pd (in claim 9 of JP4022577).

However, the purpose of the provision of the diffusion barrier layer in JP4022577 is suppression of the additional diffusion of the alkali metal element from the glass substrate in the photoelectric conversion device. In other words, the diffusion barrier layer in JP4022577 is not provided for suppression of diffusion of the alkali metal element from an alkali-metal supply layer to the substrate.

In addition, conventionally, provision of a diffusion barrier layer for suppression of diffusion of an alkali metal element or an alkaline earth metal element in a photoelectric conversion device using an anodized substrate as disclosed in JP2000-349320A has not been reported.

Further, since the difference in the thermal expansion coefficient between the diffusion barrier layer having the composition disclosed in claims 8 or 9 in JP4022577 and the Mo electrode (which is commonly used as a lower electrode) is great, stress distortion occurs in the photoelectric conversion device, and can cause microcracking, film exfoliation, and the like. However, it is known that when the lower electrode is not a Mo electrode, no ohmic contact is realized, so that the photoelectric conversion efficiency is lowered.

SUMMARY OF THE INVENTION

The present invention has been developed in view of the above circumstances.

The first object of the present invention is to provide a photoelectric conversion device which uses an anodized substrate, can realize diffusion of an alkali metal element or an alkaline earth metal element into a photoelectric conversion layer with satisfactory stability, efficiency, and repeatability during formation of the photoelectric conversion layer, and is superior in the photoelectric conversion efficiency.

The second object of the present invention is to provide a photoelectric conversion device which achieves the first object, and in which distortion is relieved and microcracking, film exfoliation, and the like are suppressed.

In order to accomplish the first and second objects, according to the first aspect of the present invention, there is provided a photoelectric conversion device. The photoelectric conversion device comprises a laminated structure including: an anodized substrate constituted by a metal substrate containing aluminum (Al) as a main component and an anodized film formed on at least one surface of the metal substrate; a lower electrode which is formed above the anodized substrate and contains molybdenum (Mo) as a main component; a photoelectric conversion layer which is formed of a semiconductor material above the lower electrode, and generates electric current when the photoelectric conversion layer absorbs light; an upper electrode formed above the photoelectric conversion layer; at least one metal supply layer which is formed in contact with or inside the lower electrode, contains one or more of alkali metal elements and alkaline earth metal elements, and supplies the one or more of alkali metal elements and alkaline earth metal elements to the photoelectric conversion layer during formation of the photoelectric conversion layer; and at least one diffusion barrier layer which is conductive and formed between the anodized substrate and the at least one metal supply layer in contact with at least one of the lower electrode and the at least one metal supply layer or inside the lower electrode, and suppresses diffusion, into the anodized substrate, of the one or more of alkali metal elements and alkaline earth metal elements contained in the at least one metal supply layer.

In this specification, the main component or the one or more main components are defined to be a component or one or more components the weight percentage of which is 98% or greater. The metal substrate may contain one or more microelements, and may be composed of pure aluminum (Al) or an alloy of aluminum and one or more other metal elements.

Preferably, the photoelectric conversion device according to the first aspect of the present invention may further have one or any possible combination of the following additional features (i) to (vii).

(i) In the photoelectric conversion device according to the first aspect of the present invention, preferably, the photoelectric conversion layer contains as at least one main component at least one semiconductor compound having a chalcopyrite structure.

(ii) In the photoelectric conversion device having the feature (i), preferably, the at least one main component of the photoelectric conversion layer is at least one semiconductor compound composed of at least one Group Ib element, at least one Group IIIb element, and at least one Group VIb element. Hereinafter, the semiconductor compound composed of at least one Group Ib element, at least one Group IIIb element, and at least one Group VIb element may be referred to as the Group I-III-VI semiconductor.

(iii) In the photoelectric conversion device having the feature (ii), preferably, the at least one Group Ib element is at least one of copper (Cu) and silver (Ag), the at least one Group IIIb element is at least one of aluminum (Al), gallium (Ga), and indium (In), and the at least one Group VIb element is at least one of sulfur (S), selenium (Se), and tellurium (Te).

(iv) In the photoelectric conversion device according to the first aspect of the present invention, preferably, the at least one metal supply layer contains sodium (Na).

(v) In the photoelectric conversion device according to the first aspect of the present invention, preferably, the at least one metal supply layer contains one or more of alkali metal salts and alkaline earth metal salts of one or more of polyacids including heteropoly acids.

(vi) In the photoelectric conversion device having the feature (v), preferably, the one or more of polyacids are one or both of molybdic acid and tungstic acid.

(vii) In the photoelectric conversion device according to the first aspect of the present invention, preferably, the at least one diffusion barrier layer contains as at least one main component at least one of chromium (Cr) and titanium (Ti).

Further, according to the second aspect of the present invention, a solar cell comprising the photoelectric conversion device according to the first aspect of the present invention is provided.

In the photoelectric conversion device according to the present invention, an anodized substrate is used, and the one or more of alkali metal elements and alkaline earth metal elements contained in the at least one metal supply layer can be diffused into the photoelectric conversion layer with satisfactory stability, efficiency, and repeatability during formation of the photoelectric conversion layer. Therefore, the photoelectric conversion device according to the present invention is superior in the photoelectric conversion efficiency. In addition, in the photoelectric conversion device according to the present invention, the distortion is relieved, and microcracking, film exfoliation, and the like are suppressed.

DESCRIPTION OF THE DRAWINGS

FIG. 2A is a schematic cross-sectional view of a first example of an anodized substrate.

FIG. 2B is a schematic cross-sectional view of a second example of an anodized substrate.

FIG. 3A is a schematic perspective view of a metal substrate.

FIG. 3B is a schematic perspective view of an anodized substrate produced by use of the metal substrate of FIG. 3A.

FIG. 4 is a diagram indicating the relationships between the lattice constant and the bandgap in representative Group I-III-VI semiconductor compounds.

DESCRIPTION OF PREFERRED EMBODIMENTS

The photoelectric conversion devices as an embodiment of the present invention and variations of the embodiment are explained below with reference to the accompanying drawings, in which the dimensions of the illustrated elements are differentiated from the dimensions of the elements of the actual photoelectric conversion device for clarification.

1. Photoelectric Conversion Device

Figure 1A:
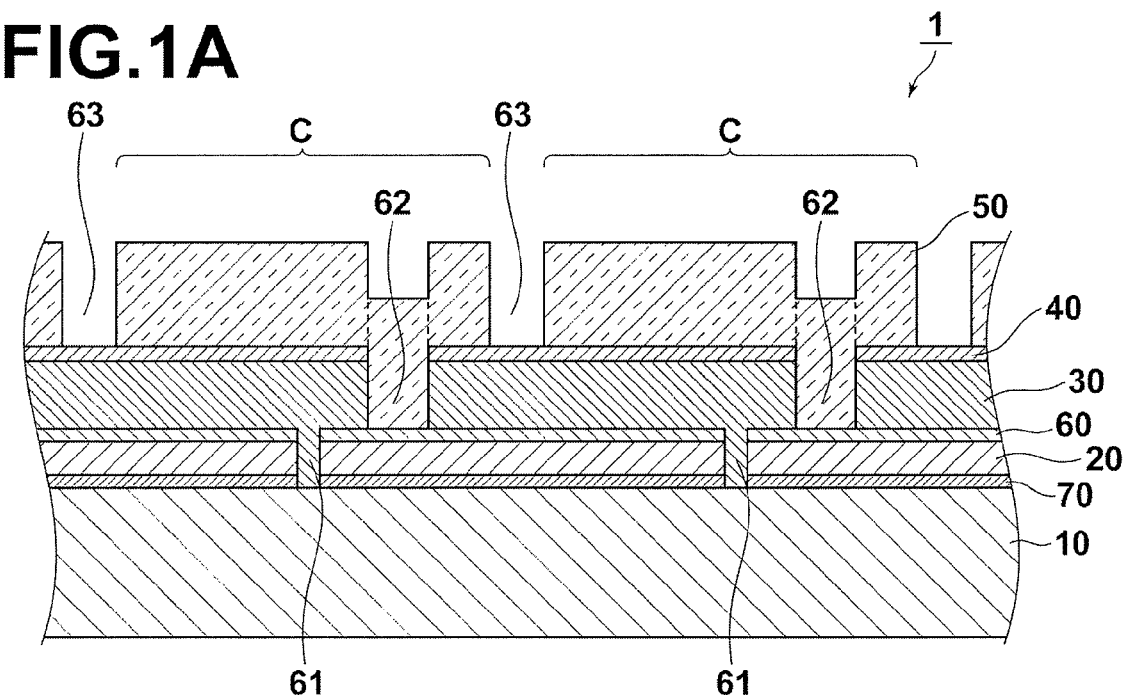
FIG. 1A is a schematic cross-sectional view illustrating a cross section, along a lateral direction, of a photoelectric conversion device according to an embodiment of the present invention.
Figure 1B:
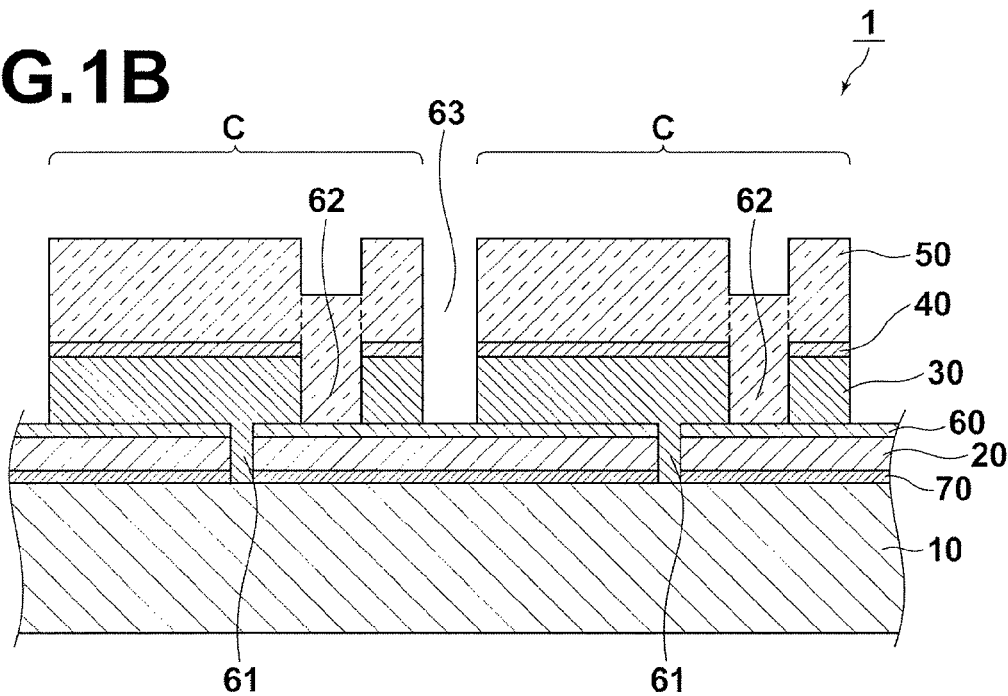
FIG. 1B is a schematic cross-sectional view illustrating a cross section, along a longitudinal direction, of the photoelectric conversion device of FIG. 1A.

FIG. 1A is a schematic cross-sectional view illustrating a cross section, along a lateral direction, of a photoelectric conversion device according to an embodiment of the present invention, and FIG. 1B is a schematic cross-sectional view illustrating a cross section, along a longitudinal direction, of the photoelectric conversion device of FIG. 1A.

The photoelectric conversion device 1 has a laminated structure as a basic structure. In the laminated structure, a lower electrode (back electrode) 20, a photoelectric conversion layer 30, a buffer layer 40, and an upper electrode 50 are formed in this order on an anodized substrate 10, and the photoelectric conversion layer 30 is formed of a semiconductor material.

In addition, a metal supply layer 60 is formed immediately above the lower electrode 20 (between the lower electrode 20 and the photoelectric conversion layer 30). The metal supply layer 60 contains one or more of alkali metal elements and alkaline earth metal elements, and supplies the one or more of alkali metal elements and alkaline earth metal elements to the photoelectric conversion layer 30 during formation of the photoelectric conversion layer 30. Further, a diffusion barrier layer 70 is formed immediately below the lower electrode 20 (between the lower electrode 20 and the anodized substrate 10). The diffusion barrier layer 70 is conductive, and suppresses diffusion, into the anodized substrate 10, of the one or more of alkali metal elements and alkaline earth metal elements contained in the metal supply layer 60.

Furthermore, first gaps 61 penetrating through the metal supply layer 60, the lower electrode 20, and the diffusion barrier layer 70 and extending in the longitudinal and lateral directions and second gaps 62 penetrating through the upper electrode 50, the buffer layer 40, and the photoelectric conversion layer 30 and extending in the longitudinal and lateral directions are formed as illustrated in FIGS. 1A and 1B. In addition, third gaps 63 penetrating through only the upper electrode 50 and extending in the longitudinal direction are formed as illustrated in FIG. 1A, and fourth gaps 64 penetrating through the upper electrode 50, the buffer layer 40, and the photoelectric conversion layer 30 and extending in the lateral direction are formed as illustrated in FIG. 1B. Thus, a great number of cells C in the photoelectric conversion device according to the present embodiment are separated by the first to fourth gaps 61 to 64.

Moreover, the second gaps 62 are filled with portions of the upper electrode 50 as illustrated in FIGS. 1A and 1B, so that the upper electrode 50 of each cell C having an adjacent cell C on a certain side is series connected to the lower electrode 20 of the adjacent cell C.

2. Anodized Substrate

The anodized substrate 10 is obtained by anodizing one or both of upper and lower surfaces of a metal substrate 11 containing aluminum as a main component. FIGS. 2A and 2B are schematic cross-sectional views of first and second examples of the anodized substrate 10. In the first example illustrated in FIG. 2A, an anodized film 12 is formed on each of the upper and lower surfaces of the metal substrate 11. In the second example illustrated in FIG. 2B, an anodized film 12 is formed on only the upper surface of the metal substrate 11. The anodized film 12 is a film containing $Al_2O_3$ as a main component.

In order to suppress warpage of the anodized substrate 10 caused by the difference in the thermal expansion coefficient between Al and $Al_2O_3$, film exfoliation caused by the warpage, and the like during a production process of the photoelectric conversion device, the first example illustrated in FIG. 2A (in which the anodized film 12 is formed on each of the upper and lower surfaces of the metal substrate 11) is preferable.

The first example illustrated in FIG. 2A can be produced by covering one of the upper and lower surfaces of the metal substrate 11 with an insulating material, anodizing the other of the upper and lower surfaces, removing the insulating material from the one of the upper and lower surfaces, and anodizing the one of the upper and lower surfaces. Alternately, both of the upper and lower surfaces may be concurrently anodized.

In the case where the anodized film 12 is formed on each of the upper and lower surfaces of the metal substrate 11, from the viewpoint of the balance of the thermal stress between the upper and lower surfaces, it is preferable that the anodized film 12 formed on each of the upper and lower surfaces be identical, or the thickness of the anodized film 12 formed on the upper side over which the photoelectric conversion layer 30 is formed is slightly smaller than the thickness of the anodized film 12 formed on the lower side.

The metal substrate 11 may be made of one of the JIS (Japanese Industrial Standards) 1000 series pure-aluminum materials and alloys of aluminum and other metal elements (e.g., Al—Mn-based alloys, Al—Mg-based alloys, Al—Mn—Mg-based alloys, Al—Zr-based alloys, Al—Si-based alloys, Al—Mg—Si-based alloys, and the like). (See Aluminum Handbook (in Japanese), 4th edition, Japan Light Metal Association, pp. 1-5 and 219-221, 1990.) Further, the metal substrate 11 may contain various microelements (e.g., Fe, Si, Mn, Cu, Mg, Cr, Zn, Bi, Ni, Ti, and the like).

The anodization can be performed, for example, by immersing the metal substrate 11 (as an anode) and a cathode (as a counter electrode) in an electrolytic solution prepared for anodization, and applying a voltage between the cathode and the metal substrate 11, where the cathode is made of carbon, aluminum, or the like. The electrolytic solution is not specifically limited, and may be an acidic electrolytic solution containing one or more of sulfuric acid, phosphoric acid, chromic acid, oxalic acid, sulfamic acid (amidosulfonic acid), benzenesulfonic acid, and the like. When necessary, washing, polishing for smoothing, and the like are performed on the metal substrate 11 before the anodization.

Although the condition of the anodization depends on the type of the electrolytic solution, no further specific condition is imposed on the anodization. The anodization can be appropriately performed, for example, under the condition that the concentration of the electrolytic solution is 1 to 80 weight percent, the temperature of the electrolytic solution is 5° C. to 70° C., the current density is 0.005 to $0.60 A/cm^2$, the applied voltage is 1 to 200 V, and the electrolysis time is 3 to 500 minutes. It is preferable that the electrolytic solution be one or a mixture of sulfuric acid, phosphoric acid, and oxalic acid. In the case where one or a mixture of sulfuric acid, phosphoric acid, and oxalic acid is used, it is preferable that the concentration of the electrolytic solution be 4 to 30 weight percent, the temperature of the electrolytic solution be 10° C. to 30° C., the current density be 0.05 to 0.30A/cm², and the applied voltage be 30 to 150 V.

FIG. 3A schematically illustrates an example of the metal substrate 11, and FIG. 3B schematically illustrates an anodized substrate produced by use of the metal substrate of FIG. 3A. When the metal substrate 11 is anodized from the surface 11s (the upper surface of the illustrated example), the anodization progresses from the surface 11s along the direction approximately perpendicular to the surface 11s, and the anodized film 12 is produced as illustrated in FIG. 3B. The main component of the anodized film 12 is $Al_2O_3$. The anodized film 12 produced by the anodization has a structure in which microcolumns 12a having approximately equilateral hexagonal shapes in a plan view are closely arranged. Micropores 12b extending from the surface 11s in the depth direction are formed approximately at the centers of the respective microcolumns 12a, and each of the microcolumns 12a has a round bottom end as illustrated in FIG. 3B. Normally, a barrier layer (normally having a thickness of 0.01 to 0.4 micrometers) is formed with the bottom portions of the microcolumns 12a, in which the micropore 12b is not formed. Alternatively, an anodized film without a micropore can be formed when the anodization condition is appropriately set.

The diameters of the micropores 12b in the microcolumns 12a are not specifically limited. However, from the viewpoint of the smoothness of the surface of the anodized film 12 and the insulation characteristics of the anodized film 12, the diameters of the micropores 12b are preferably 200 nm or smaller, and more preferably 100 nm or smaller. The diameters of the micropores 12b can be reduced to approximately 10 nm.

The density of the micropores 12b in the anodized film 12 is not specifically limited. However, from the viewpoint of the insulation characteristics of the anodized film 12, the density of the micropores 12b is preferably 100 to 10,000 per square micrometers, more preferably 100 to 5,000 per square micrometers, and particularly preferably 100 to 1,000 per square micrometers.

The (arithmetic average) surface roughness Ra of the anodized film 12 is not specifically limited. However, from the viewpoint of uniform formation of the photoelectric conversion layer 30, it is more preferable that the surface of the anodized film 12 has higher smoothness. The arithmetic average surface roughness Ra is preferably 0.3 micrometers or smaller, and more preferably 0.1 micrometers or smaller.

The thickness of each of the metal substrate 11 and the anodized film 12 is not specifically limited. However, from the viewpoint of the mechanical strength of the anodized substrate 10 and reduction of the thickness and the weight of the anodized substrate 10, the thickness of the metal substrate 11 before the anodization is preferably 0.05 to 0.6 mm, and more preferably 0.1 to 0.3 mm. In addition, from the viewpoint of the insulation characteristics and the mechanical strength of the anodized substrate 10 and reduction of the thickness and the weight of the anodized substrate 10, the thickness of the anodized film 12 is preferably 0.1 to 100 micrometers.

Further, when necessary, a known process for sealing micropores in an anodized film can be performed on the anodized film 12. It is possible to improve the withstand-voltage characteristics and the insulation characteristics by performing the process for sealing micropores.

3. Photoelectric Conversion Layer

The photoelectric conversion layer 30 generates electric current when the photoelectric conversion layer 30 absorbs light.

3.1 Composition

Although the main component of the photoelectric conversion layer 30 is not specifically limited, preferably, the main component of the photoelectric conversion layer 30 is at least one semiconductor compound having a chalcopyrite structure. More preferably, the main component of the photoelectric conversion layer 30 is at least one semiconductor compound composed of at least one Group Ib element, at least one Group IIIb element, and at least one Group VIb element. From the viewpoint of realization of high optical absorptance and high energy conversion efficiency, further preferably, the at least one Group Ib element in the main component of the photoelectric conversion layer 30 is at least one of copper (Cu) and silver (Ag), the at least one Group IIIb element in the main component of the photoelectric conversion layer 30 is at least one of aluminum (Al), gallium (Ga), and indium (In), and the at least one Group VIb element in the main component of the photoelectric conversion layer 30 is at least one of sulfur (S), selenium (Se), and tellurium (Te). The following are examples of such a semiconductor compound.

$CuAlS_2$, $CuGaS_2$, $CuInS_2$, $CuAlSe_2$, $CuGaSe_2$, $CuInSe_2$ (CIS), $AgAlS_2$, $AgGaS_2$, $AgInS_2$, $AgAlSe_2$, $AgGaSe_2$, $AgInSe_2$, $AgAlTe_2$, $AgGaTe_2$, $AgInTe_2$, $Cu(In_{1-x}Ga_x)Se_2$ (CIGS), $Cu(In_{1-x}Al_x)Se_2$, $Cu(In_{1-x}Ga_x)(S, Se)_2$, $Ag(In_{1-x}Ga_x)Se_2$, $Ag(In_{1-x}Ga_x)(S, Se)_2$

Particularly preferably, the photoelectric conversion layer 30 contains $CuInSe_2$ (CIS) and/or $Cu(In, Ga)Se_2$ (CIGS), since CIS and CIGS are semiconductors having a chalcopyrite structure, and are reported to exhibit high optical absorptance and high energy conversion efficiency. Further, since the degrees of deterioration of CIS and CIGS caused by irradiation with light are relatively small, CIS and CIGS have high durability.

The photoelectric conversion layer 30 contains impurities for realizing a semiconductor of a desired conductive type. The photoelectric conversion layer 30 can be doped with such impurities by diffusion from an adjacent layer and/or by another active doping process.

The concentrations of the constituent elements of the Group I-III-VI semiconductor and/or the impurities in the photoelectric conversion layer 30 may have a distribution, and the photoelectric conversion layer 30 may contain a plurality of regions having different semiconductor characteristics such as n-type, p-type, and i-type. For example, in the case where the photoelectric conversion layer 30 is formed of a CIGS-based material, and the Ga concentration in the photoelectric conversion layer 30 is varied along the thickness direction, the bandgap, the carrier mobility, and the like can be controlled and the photoelectric conversion layer 30 can be designed so as to realize high photoelectric conversion efficiency.

The photoelectric conversion layer 30 may contain one or more semiconductor materials other than the Group I-III-VI semiconductor. For example, the one or more semiconductor materials may be a semiconductor material which is composed of one or more Group IVb semiconductor elements such as silicon (i.e., a Group IVb semiconductor), a semiconductor material which is composed of one or more Group IIIb semiconductor elements and one or more Group Vb semiconductor elements such as GaAs (i.e., a Group III-V semiconductor), or a semiconductor material which is composed of one or more Group IIb semiconductor elements and one or more Group VIb semiconductor elements such as CdTe (i.e., a Group II-VI semiconductor).

As long as the characteristics of the photoelectric conversion layer 30 are not substantially affected, the photoelectric conversion layer 30 may contain an arbitrary component other than the impurities for realizing one or more desired conductive types of the semiconductor.

3.2 Formation of CIGS Film

The CIGS layer can be formed by multisource simultaneous evaporation, selenization, sputtering, hybrid sputtering, mechano-chemical processes, or other processes.

3.2.1 Multisource Simultaneous Evaporation Process

The three-stage process proposed by J. R. Tuttle et al., "The Performance of Cu(In,Ga)Se$_2$-Based Solar Cells in Conventional and Concentrator Applications", Material Research Society (MRS) Symposium Proceedings, Vol. 426, pp. 143-151, 1996 and the coevaporation process proposed by L. Stolt et al., "THIN FILM SOLAR CELL MODULES BASED ON CU(IN,GA)SE$_2$ PREPARED BY THE COEVAPORATION METHOD", Proceedings of the 13th European Photovoltaic Solar Energy Conference, pp. 1451-1455, 1995 are known as the multisource simultaneous evaporation processes for formation of a CIGS layer.

In the three-stage process, initially, evaporation of In, Ga, and Se is simultaneously performed in a high vacuum at the substrate temperature of 300° C. Then, the substrate temperature is raised to 500° C. to 560° C., and evaporation of Cu and Se is simultaneously performed. Thereafter, evaporation of In, Ga, and Se is simultaneously performed again. On the other hand, in the coevaporation process proposed by L. Stolt et al., Cu-rich CIGC is evaporated in the initial stage, and thereafter In-rich CIGS is evaporated.

Further, in order to improve the crystallinity of the CIGS film, the following techniques for improving the three-stage process and the coevaporation process have been proposed.

(a) A technique using ionized gallium, which is proposed, for example, by H. Miyazaki et al., "Growth of high-quality CuGaSe$_2$ thin films using ionized Ga precursor", Physica status solidi (a), Vol. 203, No. 11, pp. 2603-2608, 2006.

(b) A technique using cracked selenium, which is proposed, for example, by M. Kawamura et al., "Growth of Cu(In$_{1-x}$Ga$_x$)Se$_2$ thin films using cracked selenium", Proceedings of the 68th Autumn Meeting of the Japan Society of Applied Physics (held at Hokkaido Institute of Technology in 2007), Lecture No. 7p-L-6.

(c) A technique using radical selenium, which is proposed, for example, by S. Ishizuka et al., "Preparation of Cu(In$_{1-x}$Ga$_x$)Se$_2$ thin films using a Se-radical beam source and solar cell performance", Proceedings of the 54th Spring Meeting of the Japan Society of Applied Physics (held at Aoyama Gakuin University in 2007), Lecture No. 29p-ZW-10.

(d) A technique using a photo-excited deposition process, which is proposed, for example, by Y. Ishii et al., "High Quality CIGS Thin Films and Devices by Photo-Excited Deposition Process", in the Proceedings of the 54th Spring Meeting of the Japan Society of Applied Physics (held at Aoyama Gakuin University in 2007), Lecture No. 29p-ZW-14.

3.2.2 Selenization Process

A process for formation of a CIGS layer by selenization is also called the two-stage process. In the two-stage process, first, a laminated film of metal precursors such as a lamination of Cu layer and an In layer, a lamination of a (Cu—Ga) layer and an In layer, or the like is formed by sputtering, evaporation, electrodeposition, or the like. Then, the laminated film is heated to the temperature of approximately 450° C. to 550° C. in selenium vapor or hydrogen selenide so as to produce a selenium compound such as Cu(In$_{1-x}$Ga$_x$)Se$_2$ by thermal diffusion reaction. A selenization process using the selenium vapor, hydrogen selenide, or the like as above is called a vapor-phase selenization process. Alternatively, a solid-phase selenization process may be used. In the solid-phase selenization process, solid-phase selenium is deposited on metal precursor films, and the metal precursor films are selenized by solid-phase diffusion reaction in which the solid-phase selenium behaves as a selenium source.

In addition, in order to prevent rapid volume increase which can be caused by the selenization, the following techniques are previously proposed. According to the first technique, a predetermined proportion of selenium is mixed in advance into the metal precursors as proposed, for example, by T. Nakada et al., "CuInSe$_2$-based solar cells by Se-vapor selenization from Se-containing precursors", Solar Energy Materials and Solar Cells, Vol. 35, pp. 209-214, 1994. According to the second technique, a multilayer precursor film in which thin metal films are interleaved by selenium layers (e.g., a lamination of a Cu layer, an In layer, a Se layer, . . . , a Cu layer, an In layer, and a Se layer) is formed as proposed, for example, by T. Nakada et al., "THIN FILMS OF CuInSe$_2$ PRODUCED BY THERMAL ANNEALING OF MULTILAYERS WITH ULTRA-THIN STACKED ELEMENTAL LAYERS", Proceedings of the 10th European Photovoltaic Solar Energy Conference (EU PVSEC), pp. 887-890, 1991.

Further, a process for forming a CIGS film having a graded bandgap has been proposed, for example, by K. Kushiya et al., "Fabrication of graded band-gap Cu(InGa)Se$_2$ thin-film mini-modules with a Zn(O,S,OH)$_x$ buffer layer", Solar Energy Materials and Solar Cells, Vol. 49, pp. 277-283, 1997. According to this process, first, a film of a Cu—Ga alloy is deposited, and a film of In is deposited on the film of the Cu—Ga alloy. Then, before selenization of the films, a graded concentration of Ga along the thickness direction is realized by natural thermal diffusion.

3.2.3 Sputtering Process

The following processes are known as the sputtering processes for formation of a CIGS layer. According to the first process, a target of polycrystalline CuInSe$_2$ is used. The second process is a double-source sputtering process which is proposed, for example, by J. H. Ermer et al., "CdS/CuInSe$_2$ JUNCTIONS FABRICATED BY DC MAGNETRON SPUTTERING OF Cu$_2$Se AND In$_2$Se$_3$", Proceedings of the 18th IEEE Photovoltaic Specialists Conference, pp. 1655-1658, 1985. In the double-source sputtering process, a Cu$_2$Se target and an In$_2$Se$_3$ target are used, and a mixture of H$_2$Se and Ar is used as sputtering gas. The third process is a triple-source sputtering process which is proposed, for example, by T. Nakada et al., "Polycrystalline CuInSe$_2$ Thin Films for Solar Cells by Three-Source Magnetron Sputtering", Japanese Journal of Applied Physics, Vol. 32, Part 2, No. 8B, pp. L1169-L1172, 1993. In the triple-source sputtering process, a Cu target, an In target, and a target of Se or CuSe are used, and sputtering is performed in Ar gas.

3.2.4 Hybrid Sputtering Process

A known hybrid sputtering process for formation of a CIGS layer, which is proposed, for example, by T. Nakada et al., "Microstructural Characterization for Sputter-Deposited CuInSe$_2$ Films and Photovoltaic Devices", Japanese Journal of Applied Physics, Vol. 34, Part 1, No. 9A, pp. 4715-4721, 1995 is different from the aforementioned triple-source sputtering process in that Cu and In are deposited by DC sputtering, and Se is deposited by evaporation.

3.2.5 Mechano-Chemical Process

A known mechano-chemical process for formation of a CIGS layer is proposed, for example, by T. Wada et al., "Fabrication of Cu(In,Ga)Se$_2$ thin films by a combination of mechanochemical and screen-printing/sintering processes", Physica status solidi (a), Vol. 203, No. 11, pp. 2593-2597, 2006. In the mechano-chemical process, raw materials corresponding to the composition of the CIGS layer are put into a planetary ball mill and mixed by mechanical energy so as to obtain a CIGS powder. Thereafter, the CIGS powder is applied to a surface of a substrate by screen printing, and then the applied CIGS powder is annealed so as to obtain a CIGS film.

3.2.6 Other Processes

In addition to the above processes, the CIGS layer can also be formed by screen printing, close-spaced sublimation, MOCVD (metal organic chemical vapor deposition), spraying, or the like. As disclosed, for example, in Japanese Unexamined Patent Publication Nos. 9(1997)-074065 and 9(1997)-074213, it is possible to obtain a crystal having a desired composition by forming a film of microparticles containing one or more Group Ib elements, one or more Group IIIb elements, and one or more Group VIb elements on a substrate by screen printing, spraying, or the like, and then thermally cracking the film. The processing for thermally cracking the film may be performed in an atmosphere of one or more Group VIb elements.

3.3 Control of Bandgap

FIG. 4 is a diagram indicating the relationships between the lattice constant and the bandgap in representative Group I-III-VI semiconductor compounds. It is possible to realize various bandgaps by controlling the composition of the Group I-III-VI semiconductor compound. When a photon having energy greater than the bandgap of a semiconductor is injected into the semiconductor, the excess energy above the bandgap becomes thermal loss. Theoretical calculations based on the spectrum of the sunlight and various bandgaps teach that the photoelectric conversion efficiency is maximized when the bandgap is approximately 1.4 to 1.5 eV.

It is possible to realize the bandgap achieving high photoelectric conversion efficiency, for example, by increasing the bandgap, and the bandgap can be increased by increasing the Ga concentration in $Cu(In, Ga)Se_2$ (CIGS), increasing the Al concentration in $Cu(In, Al)Se_2$, or increasing the S concentration in $Cu(In, Ga)(S, Se)_2$. The bandgap of CIGS can be controlled in the range of 1.04 to 1.68 eV.

It is possible to realize a graded band structure by producing a variation of the composition along the thickness direction. The graded band structure includes a first type having a single graded bandgap and a second type having a double graded bandgap. The single graded bandgap increases along the direction from the light-entrance side to the opposite side. The double graded bandgap decreases along the direction from the light-entrance side toward the opposite side in the region from the light-entrance side to the pn connection, and increases along the same direction in the region beyond the pn connection. (See, for example, T. Dullweber et al., "A new approach to high-efficiency solar cells by band gap grading in $Cu(In,Ga)Se_2$ chalcopyrite semiconductors", Solar Energy Materials and Solar Cells, Vol. 67, pp. 145-150, 2001.) In each of the first and second types, the gradation in the band structure causes an internal electric field, which accelerates the carriers generated by optical excitation, so that the carriers can easily reach the electrode, and the possibility of combination of the carriers with recombination centers is decreased. Thus, the efficiency in electric power generation is increased. (See, for example, U.S. Patent Application Publication No. 20060220059.)

In the case where a plurality of semiconductors having different bandgaps suitable for different regions of the spectrum are used, it is possible to decrease the thermal loss caused by deviation of the photon energy from the bandgap, and therefore increase the efficiency in electric power generation. The solar cells in which a plurality of photoelectric conversion layers having different bandgaps as above are laminated are called the tandem solar cells. The efficiency in electric power generation in the two-layer tandem solar cells can be increased, for example, by using a combination of the photoelectric conversion layers respectively having the bandgaps of 1.1 eV and 1.7 eV.

4. Electrodes and Buffer Layer

The lower electrode 20 and the upper electrode 50 are each formed of an electrically conductive material. In addition, the upper electrode 50, which is located on the light-entrance side, is required to be transparent.

In the present embodiment, the lower electrode 20 contains Mo as a main component. Although the thickness of the lower electrode 20 is not specifically limited, the thickness of the lower electrode 20 is preferably 0.3 to 1.0 micrometers.

Although the main component of the upper electrode 50 is not specifically limited, the main component of the upper electrode 50 is preferably one or more of ZnO, ITO (indium tin oxide), and $SnO_2$. Although the thickness of the upper electrode 50 is not specifically limited, the thickness of the upper electrode 50 is preferably 0.6 to 1.0 micrometers.

The lower electrode 20 and the upper electrode 50 may have either a single layer structure or a laminated structure (e.g., a two-layer structure).

Although the technique used for forming the lower electrode 20 and the upper electrode 50 is not specifically limited, the lower electrode 20 and the upper electrode 50 may be formed by vapor phase deposition such as electron beam (EB) evaporation or sputtering.

Although the main component of the buffer layer 40 is not specifically limited, the main component of the buffer layer 40 is preferably one or more of CdS, ZnS, ZnO, ZnMgO, and ZnS(O, OH). Although the thickness of the buffer layer 40 is not specifically limited, the thickness of the buffer layer 40 is preferably 0.03 to 0.1 micrometers.

In a preferable example, the compositions of the lower electrode 20, the buffer layer 40, the photoelectric conversion layer 30, and the upper electrode 50 are respectively Mo, CdS, CIGS, and ZnO.

Although the conductive types of the photoelectric conversion layer 30, the buffer layer 40, and the upper electrode 50 are not specifically limited, normally, the photoelectric conversion layer 30 is a p-type, the buffer layer 40 is an n-type (e.g., an n-type CdS), the upper electrode 50 is an n-type (e.g., an n-type ZnO) or a laminated structure of an i-type layer and an n-type layer (e.g., an i-type ZnO layer and an n-type ZnO layer). It is considered that in such a structure, a pn junction or a pin junction is realized between the photoelectric conversion layer 30 and the upper electrode 50. In the structure in which the buffer layer 40 of CdS is formed on the photoelectric conversion layer 30, Cd diffuses into the photoelectric conversion layer 30, so that an n-type layer is formed in the near surface region of the photoelectric conversion layer 30, and a pn junction is realized in the photoelectric conversion layer 30. Alternatively, it is possible to realize a pin junction in the photoelectric conversion layer 30 by further forming an i-type layer under the n-type layer in the photoelectric conversion layer 30.

5. Metal Supply Layer

The metal supply layer 60 contains one or more of alkali metal elements and alkaline earth metal elements, and supplies the one or more of alkali metal elements and alkaline earth metal elements to the photoelectric conversion layer 30 during formation of the photoelectric conversion layer 30. In the present embodiment, the metal supply layer 60 is formed of a conductive material immediately above and in contact with the lower electrode 20. Alternatively, the metal supply layer 60 may be formed of an insulating material. The metal supply layer 60 may have either a single layer structure or a laminated structure of layers having different compositions.

The alkali metal elements which can constitute the metal supply layer 60 include Li, Na, K, Rb, and Cs, and the alkaline earth metal elements which can constitute the metal supply layer 60 include Be, Mg, Ca, Sr, and Ba. From the viewpoints of availability of a compound which is chemically stable and capable of being easily handled, tendency to be emitted from the metal supply layer 60 when being heated, and the effect of greatly improving the crystallinity of the photoelectric conversion layer 30, the metal supply layer 60 contains preferably one or more of the alkali metal elements Na, K, Rb, and Cs, more preferably one or both of Na and K, and particularly preferably Na.

When the metal supply layer 60 contains one or more compounds of one or more of alkali metal elements and alkaline earth metal elements, the one or more compounds may be either organic or inorganic. Inorganic salts such as sodium fluoride, potassium fluoride, sodium sulfide, potassium sulfide, sodium selenide, potassium selenide, sodium chloride, and potassium chloride are examples of compounds of alkali metal elements which may be contained in the metal supply layer 60. In addition, organic salts such as sodium salts or potassium salts of an organic acid (e.g., a polyacid, which may be a heteropoly acid) are also examples of compounds of alkali metal elements which may be contained in the metal supply layer 60. Further, inorganic salts such as calcium fluoride, magnesium fluoride, calcium sulfide, magnesium sulfide, and calcium selenide are examples of compounds of alkaline earth metal elements which may be contained in the metal supply layer 60. Furthermore, organic salts such as calcium salts or magnesium salts of an organic acid (e.g., a polyacid, which may be a heteropoly acid) are also examples of compounds of alkaline earth metal elements which may be contained in the metal supply layer 60. In this specification, the polyacids referred to are assumed to include heteropoly acids.

In particular, the metal supply layer 60 preferably contains one or more of alkali metal salts and alkaline earth metal salts of a polyacid. Such compounds (salts) are chemically stable, and the metal supply layer 60 formed of one or more of such compounds is exfoliation resistant. Further, such compounds can be decomposed by heat, so that the metal supply layer 60 can efficiently emit the one or more of alkali metal elements and alkaline earth metal elements. Therefore, the photoelectric conversion layer 30 containing the above compounds (salts) exhibits high photoelectric conversion efficiency.

Among the alkali metal salts and alkaline earth metal salts of the polyacids, alkali metal salts and alkaline earth metal salts of polyoxoacids and the like are preferable. Tungstophosphoric acid, tungstosilicic acid, molybdophosphoric acid, molybdosilicic acid, vanadic acid, tungstic acid, low-valent niobic acid, low-valent tantalic acid, titanic acid having a tunnel structure, and molybdic acid are examples of the polyoxoacids.

Specifically, α-12-tungstophosphoric acid, α-12-tungstosilicic acid, α-12-molybdophosphoric acid, α-12-molybdosilicic acid, 18-tungsto-2-phosphoric acid, 18-molybdo-2-phosphoric acid, α-11-tungstophosphoric acid, α-11-tungstosilicic acid, α-11-molybdophosphoric acid, α-11-tungstophosphoric acid, γ-10-tungstosilicic acid, A-α-9-tungstophosphoric acid, A-α-9-tungstosilicic acid, A -α-9-molybdophosphoric acid, A-α-9-molybdosilicic acid, decavanadic acid, orthovanadic acid, decatungstic acid, octaperoxo-4-tungstophosphoric acid, hexatitanic acid, octatitanic acid, ramsdellite-type titanic acid, hollandite-type titanic acid +molybdic acid, and molybdenum giant cluster are examples of the polyoxoacids.

Among the above examples of the polyoxoacids, molybdic acid and/or tungstic acid are preferable, and molybdic acid is particularly preferable.

Further specifically, sodium molybdate may be $Na_2Mo_2O_7$, $Na_6Mo_7O_{24}$, $Na_2Mo_{10}O_{31}$, $Na_{15}[Mo_{154}O_{462}H_{14}(H_2O)_{70}]_{0.5}$ $[Mo_{152}O_{457}H_{14}(H_2O)_{68}]_{0.5}$, and the like. In addition, molybdic acid salts of each of the other alkali metal elements and alkaline earth metal elements can be determined in a similar manner to the molybdic acid salts of sodium.

A thin film of sodium molybdate can be formed, for example, by adjusting to a necessary value the pH of a solution containing molybdic acid (such as $MoO_3$) and/or an alkali metal salt of molybdic acid (such as $Na_2[MoO_4]$) with an alkaline agent such as sodium hydroxide or nitric acid, applying the solution to the anodized substrate 10 (on which the lower electrode 20 is formed) by spin coating or the like, and drying the applied solution by heating. Although the heating temperature is not specifically limited, the heating temperature is, for example, approximately 200° C. Alternatively, the thin film of sodium molybdate can be formed by vapor phase deposition such as PVD (physical vapor phase deposition) or CVD (chemical vapor phase deposition) using as an evaporation source an alkali metal salt of molybdic acid, which is synthesized or isolated in advance. The PVD may be sputtering or evaporation.

Although many polyacids contain Mn or a Group VIII metal element such as Fe, such polyacids are not preferable because if Mn or a Group VIII metal element such as Fe diffuses into a CIS layer or a CIGS layer, the diffused metal element behaves as a recombination center and decreases the efficiency. In addition, the phosphoric acid-based polyacids are not preferable because the phosphoric acid-based polyacids highly absorb moisture.

The concentration of the one or more of alkali metal elements and alkaline earth metal elements in the metal supply layer 60 is not specifically limited as long as the concentration is at such a level that the metal supply layer 60 can supply a sufficient amount of alkali metal elements and/or alkaline earth metal elements to the photoelectric conversion layer 30. In addition, the thickness of the metal supply layer 60 is not specifically limited as long as the thickness is at such a level that the metal supply layer 60 can supply a sufficient amount of alkali metal elements and/or alkaline earth metal elements to the photoelectric conversion layer 30. For example, the thickness of the metal supply layer 60 is preferably 100 to 200 nm.

6. Diffusion Barrier Layer

The diffusion barrier layer 70 is provided for suppressing diffusion into the anodized substrate 10 of the one or more of alkali metal elements and/or alkaline earth metal elements contained in the metal supply layer 60. In the present embodiment, the diffusion barrier layer 70 is formed of an electrically conductive material immediately below and in contact with the lower electrode 20.

The composition of the diffusion barrier layer 70 is not specifically limited as long as the composition realizes the function of suppressing diffusion of the one or more of alkali metal elements and/or alkaline earth metal elements. However, the diffusion barrier layer 70 is preferably formed of a material having a thermal expansion coefficient approximately identical to the thermal expansion coefficient of the anodized substrate 10. Specifically, it is preferable that the thermal expansion coefficient of the diffusion barrier layer 70 be approximately identical to the thermal expansion coefficient of aluminum oxide. In this specification, unless otherwise specified, the thermal expansion coefficient of a material (having a composition) means the linear expansion coefficient, at 500K, of a bulk material having the same composition. 500K is approximately the midpoint between the room temperature and the growth temperature of the photoelectric conversion layer 30.

The linear expansion coefficient of aluminum oxide is $7.5 \times 10^{-6}$/K. In this specification, the materials having the linear expansion coefficient of $7.5 \times 10^{-6}$/K$\pm 2.5 \times 10^{-6}$/K (i.e., in the range from $5.0 \times 10^{-6}$/K to $10.0 \times 10^{-6}$/K) is defined as the materials having the thermal expansion coefficient approximately identical to the thermal expansion coefficient of aluminum oxide.

The main component of the diffusion barrier layer 70 is preferably chromium (having the linear expansion coefficient of $8.8 \times 10^{-6}$/K) and/or titanium (having the linear expansion coefficient of $9.9 \times 10^{-6}$/K). The diffusion barrier layer 70 may have a laminated structure of one or more Ti layers and one or more Cr layers.

The above values of the linear expansion coefficients are indicated in "Butsuri Data Jiten (Physical Data Book, in Japanese)," The Physical Society of Japan (ed.), Asakura Publishing, pp. 161-163, 2006.

The thickness of the diffusion barrier layer 70 is not specifically limited as long as the thickness is at such a level that the diffusion barrier layer 70 can satisfactorily suppress diffusion of the one or more of alkali metal elements and/or alkaline earth metal elements into the anodized substrate 10. Preferably, the thickness of the diffusion barrier layer 70 is preferably approximately 20 to 200 nm.

7. Other Layers

It is possible to arrange an arbitrary layer other than the layers explained above, when necessary. For example, it is possible to arrange an adhesion layer (buffer layer) between the anodized substrate 10 and the lower electrode 20, and/or between the lower electrode 20 and the photoelectric conversion layer 30 for enhancing the adhesiveness between the layers sandwiching the adhesion layer when necessary.

8. Advantages

The photoelectric conversion device 1 according to the present embodiment has the following advantages.

Since the photoelectric conversion device 1 according to the present embodiment uses the anodized substrate 10, the photoelectric conversion device 1 is lightweight and flexible, and can be manufactured at low cost.

As explained before, the photoelectric conversion device 1 comprises the metal supply layer 60 and the diffusion barrier layer 70. The metal supply layer 60 is formed immediately above and in contact with the lower electrode 20, contains the one or more of alkali metal elements and alkaline earth metal elements, and supplies the one or more of alkali metal elements and alkaline earth metal elements to the photoelectric conversion layer 30 during formation of the photoelectric conversion layer 30. The diffusion barrier layer 70 is formed of an electrically conductive material immediately below and in contact with the lower electrode 20, and suppresses diffusion of the one or more of alkali metal elements and/or alkaline earth metal elements into the anodized substrate 10.

Since the metal supply layer 60 is formed immediately below the photoelectric conversion layer 30, the one or more of alkali metal elements and alkaline earth metal elements can be efficiently supplied to (diffused into) the photoelectric conversion layer 30. In addition, since the diffusion barrier layer 70 is formed immediately below the lower electrode 20, diffusion of the one or more of alkali metal elements and alkaline earth metal elements into the anodized substrate 10 can be suppressed during the process before the formation of the photoelectric conversion layer 30.

Therefore, according to the present embodiment, the one or more of alkali metal elements and alkaline earth metal elements can be supplied to (diffused into) the photoelectric conversion layer 30 with satisfactory stability, efficiency, and repeatability during formation of the photoelectric conversion layer 30 so as to achieve a desired concentration of the one or more of alkali metal elements and alkaline earth metal elements in the photoelectric conversion layer 30. In addition, according to the present embodiment, the concentration of the one or more of alkali metal elements and alkaline earth metal elements supplied to the photoelectric conversion layer 30 during the formation of the photoelectric conversion layer 30 is approximately uniform over the entire area of the photoelectric conversion layer 30.

Since the one or more of alkali metal elements and alkaline earth metal elements can be stably supplied to the photoelectric conversion layer 30 so as to achieve the desired concentration, the crystallinity of the photoelectric conversion layer 30 is satisfactory, and the photoelectric conversion device is superior in the photoelectric conversion efficiency.

Since diffusion of the one or more of alkali metal elements and alkaline earth metal elements into the anodized substrate 10 can be suppressed during the process before the formation of the photoelectric conversion layer 30, deterioration of the anodized film 12 caused by the diffusion of the one or more of alkali metal elements and alkaline earth metal elements can be suppressed. In addition, distortion of the photoelectric conversion device and film exfoliation, microcracking, and the like of the photoelectric conversion layer 30 can also be suppressed, where the film exfoliation, microcracking, and the like of the photoelectric conversion layer 30 can be caused by the deterioration of the anodized film 12.

As mentioned before, the main component of the diffusion barrier layer 70 is preferably Cr and/or Ti. In this case, the difference in the thermal expansion coefficient between the anodized substrate 10 and the diffusion barrier layer 70 is small. Therefore, it is possible to suppress distortion of the photoelectric conversion device, and film exfoliation, microcracking, and the like of the photoelectric conversion layer 30, which can be caused by the difference in the thermal expansion coefficient.

According to the present embodiment, the diffusion barrier layer 70 is formed of an electrically conductive material, and each of the metal supply layer 60 and the diffusion barrier layer 70 is arranged in contact with the lower electrode 20. Such an arrangement is effective in suppressing increase of the thickness of the lamination formed on the substrate, distortion of the photoelectric conversion device, and film exfoliation, microcracking, and the like of the photoelectric conversion layer 30.

The photoelectric conversion device according to the present embodiment can be preferably used in solar cells or the like. A solar cell can be produced by attaching a cover glass, a protection film, and the like to the photoelectric conversion device as appropriate.

9. Variations

Although the metal supply layer 60 is formed immediately above the lower electrode 20 and the diffusion barrier layer 70 is immediately below the lower electrode 20, generally, one or more metal supply layers and one or more diffusion barrier layers may be arranged in the photoelectric conversion device according to the present invention, and the numbers and the locations of the one or more metal supply layers and one or more diffusion barrier layers are not limited to the embodiment explained before.

In the case where at least one metal supply layer is arranged in contact with or inside the lower electrode 20, and at least one diffusion barrier layer is arranged between the anodized substrate 10 and the at least one metal supply layer in contact with at least one of the lower electrode 20 and the at least one metal supply layer or inside the lower electrode 20, it is possible to achieve similar advantages to the photoelectric conversion device according to the embodiment explained before.

Figure 5:
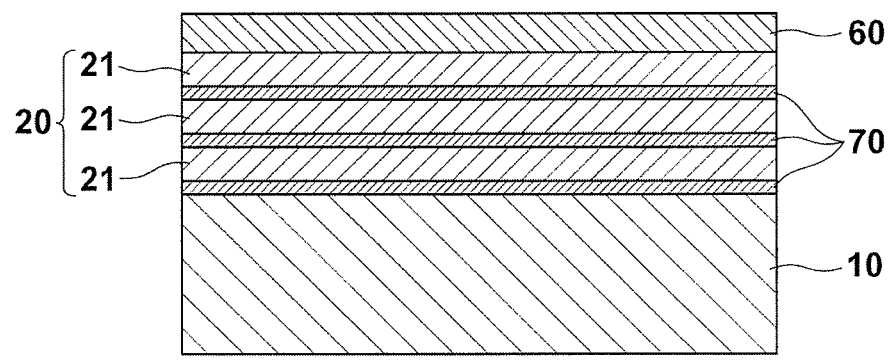
FIG. 5 is a schematic partial cross-sectional view of a first variation of the photoelectric conversion device according to the present embodiment.

FIG. 5 is a schematic partial cross-sectional view of a first variation of the photoelectric conversion device according to the present embodiment. In the variation of FIG. 5, the metal supply layer 60 is arranged immediately above the lower electrode 20, and a plurality of diffusion barrier layers 70 are arranged immediately below and inside the lower electrode 20. The lower electrode 20 is divided into a plurality of Mo sublayers 21 by two of the diffusion barrier layers 70.

Even in the case where a plurality of diffusion barrier layers is arranged, for example, as illustrated in FIG. 5, the thickness of each diffusion barrier layer, the total thickness of the plurality of diffusion barrier layers, and the total thickness of the plurality of sublayers constituting the lower electrode 20 are not specifically limited.

In consideration of the conductive contact with the photoelectric conversion layer 30, at least the uppermost one of the Mo sublayers constituting the lower electrode 20 is required to have a sufficient thickness. The thickness of the uppermost one of the Mo sublayers is preferably 50 nm or greater, and more preferably 50 to 200 nm. The total thickness of the Mo sublayers is preferably 0.45 to 0.8 µm. In addition, preferably, the total thickness of the plurality of diffusion barrier layers 70 is approximately 20 to 100 nm.

Figure 6:
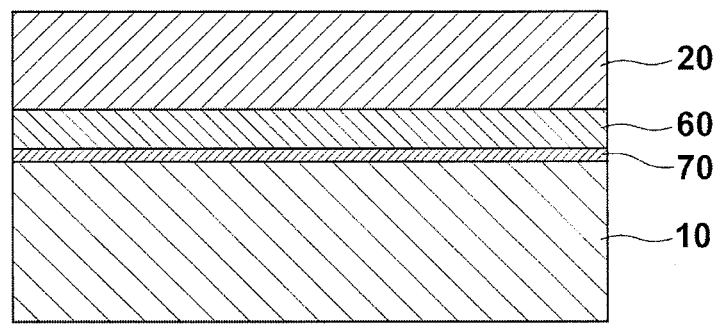
FIG. 6 is a schematic partial cross-sectional view of a second variation of the photoelectric conversion device according to the present embodiment.

FIG. 6 is a schematic partial cross-sectional view of a second variation of the photoelectric conversion device according to the present embodiment. In the variation of FIG. 6, the metal supply layer 60 and the diffusion barrier layer 70 are arranged between the anodized substrate 10 and the lower electrode 20.

The present invention is not limited to the embodiment and the variations explained above, and the structures of the embodiment and the variations may be further modified within the scope of the present invention when necessary.

10. Examples

The present inventors have produced concrete examples 1 and 2 of the photoelectric conversion device according to the present invention and a comparison example as indicated below.

10.1 Concrete Example 1

The concrete example 1 of the photoelectric conversion device according to the present invention has been produced as follows.

First, a metal substrate of the aluminum alloy 1050 (having the aluminum purity of 99.5% and the thickness of 0.30 mm) has been prepared, and an anodized film has been formed on each surface of the metal substrate by anodization under the condition that the electrolytic solution is a 0.5M water solution of oxalic acid, the electrolysis temperature is 16° C., and the DC supply voltage is 40V. Then, the metal substrate with the anodized film has been water washed and dried. Thus, an anodized substrate has been obtained, where the thickness of the anodized film has been 9.0 µm (including the thickness 0.38 µm of the barrier layer), and the diameters of the micropores have been approximately 100 nm.

Next, a film of titanium having the thickness of 50 nm has been formed as a diffusion barrier layer by evaporation on the anodized substrate, and thereafter a film of molybdenum having the thickness of 0.6 µm has been evaporated as a lower electrode by RF sputtering.

Subsequently, a layer of sodium molybdate having the thickness of 100 nm has been formed as a metal supply layer as indicated below. First, a mixture, in a volume ratio of 1:1, of ethylene glycol and a solution prepared by dissolving $MoO_3$ in a water solution of sodium hydroxide has been prepared, and applied to the lower electrode by spin coating. Then, the applied mixture has been slowly dried on a hot plate at 70° C., and has thereafter been heat treated at 200° C. for an hour. Thus, a metal supply layer containing $Na_2Mo_2O_7$, $Na_6Mo_7O_{24}$, and $Na_2Mo_{10}O_{31}$ has been formed. Alternatively, a metal supply layer having a similar composition can be formed similarly by using a solution prepared by dissolving $Na_2MoO_4$ in dilute nitric acid, instead of the solution prepared by dissolving $MoO_3$ in a water solution of sodium hydroxide.

Thereafter, a thin film of Cu(In, Ga)$Se_2$ having a thickness of 2 µm has been formed as a photoelectric conversion layer on the metal supply layer by multisource simultaneous evaporation as indicated below. In the multisource simultaneous evaporation process, evaporation sources of Cu, In, Ga, and Se have been arranged in a vacuum chamber, and the evaporation has been performed in the vacuum of approximately $10^{-4}$ Pa. During the evaporation, the evaporation rate from each source has been controlled, and the maximum substrate temperature has been 550° C.

Next, a CdS film having a thickness of approximately 50 nm has been formed as a buffer layer by chemical deposition. Then, a high-resistance ZnO film having a thickness of 0.1 µm (which is not illustrated in FIGS. 1A and 1B) has been formed on the buffer layer by RF sputtering, and a ZnO:Al film having a thickness of 0.6 µm has been formed as an upper electrode on the high-resistance ZnO film.

Finally, a grid electrode of aluminum has been formed on the structure layered as above, by evaporation, and then the layered structure has been cut into twenty samples of the photoelectric conversion device each having the dimensions of 10 mm×5 mm.

10.2 Evaluation of Concrete Example 1

The photoelectric conversion efficiency of the photoelectric conversion device as the concrete example 1 has been evaluated by using AM (air mass) 1.5 simulated sunlight with the intensity of 100 mW/cm$^2$. Specifically, the photoelectric conversion efficiency of each of the twenty samples of the photoelectric conversion device which have been produced under identical condition (with identical thicknesses of the diffusion barrier layer and the metal supply layer) has been measured, and ones of the samples being produced under the identical condition and exhibiting the photoelectric conversion efficiency equal to or greater than 80% of the maximum value among the samples produced under the identical condition have been determined to be acceptable, and the other of the samples have been determined to be unacceptable. The photoelectric conversion efficiency of the acceptable samples has been found to be 14% to 16%, which are higher than the photoelectric conversion efficiency of the comparison example (explained later).

10.3 Concrete Example 2

The concrete example 2 of the photoelectric conversion device according to the present invention has been produced in a similar manner to the concrete example 1 except that the diffusion barrier layer has been formed of chromium, instead of titanium. The photoelectric conversion efficiency of each sample of the concrete example 2 has been measured in a similar manner to the concrete example 1, and has been found to be 14% to 16%.

10.4 Comparison Example

A photoelectric conversion device as the comparison example has been produced in a similar manner to the concrete example 1 except that the diffusion barrier layer is not provided. The photoelectric conversion efficiency of the comparison example has been measured in a similar manner to the concrete example 1, and has been found to be 10% to 12%.

11. Industrial Usability

The photoelectric conversion device according to the present invention can be preferably used in solar cells, infrared sensors, and the like.

What is claimed is:

1. A photoelectric conversion device which has a laminated structure including:
    an anodized substrate constituted by a metal substrate containing aluminum as a main component and an anodized film formed on at least one surface of the metal substrate;
    a lower electrode which is formed above said anodized substrate and contains molybdenum as a main component;
    a photoelectric conversion layer which is formed of a semiconductor material above said lower electrode, and generates electric current when the photoelectric conversion layer absorbs light;
    an upper electrode formed above said photoelectric conversion layer;
    at least one metal supply layer which is formed in contact with or inside said lower electrode, contains one or more of alkali metal elements and alkaline earth metal elements, and supplies the one or more of alkali metal elements and alkaline earth metal elements to said photoelectric conversion layer during formation of the photoelectric conversion layer; and
    at least one diffusion barrier which is conductive and formed between said anodized substrate and said at least one metal supply layer in contact with at least one of said lower electrode and the at least one metal supply layer or inside said lower electrode, and suppresses diffusion, into said anodized substrate, of said one or more of alkali metal elements and alkaline earth metal elements contained in the at least one metal supply layer,
    wherein the at least one metal supply layer that contains one or more types of alkali metal elements and alkali earth metal elements is provided within the lower electrode or between the lower electrode and the anodized substrate; and
    wherein said at least one diffusion barrier layer contains as at least one main component at least one of chromium and titanium.

2. A photoelectric conversion device according to claim 1, wherein said photoelectric conversion layer contains as at least one main component at least one semiconductor compound having a chalcopyrite structure.

3. A photoelectric conversion device according to claim 2, wherein said at least one main component of the photoelectric conversion layer is at least one semiconductor compound composed of at least one Group Ib element, at least one Group IIIb element, and at least one Group VIb element.

4. A photoelectric conversion device according to claim 3, wherein said at least one Group Ib element is at least one of copper and silver, said at least one Group IIIb element is at least one of aluminum, gallium, and indium, and said at least one Group VIb element is at least one of sulfur, selenium, and tellurium.

5. A photoelectric conversion device according to claim 1, wherein said at least one metal supply layer contains sodium.

6. A photoelectric conversion device according to claim 1, wherein said at least one metal supply layer contains one or more of alkali metal salts and alkaline earth metal salts of one or more of polyacids including heteropoly acids.

7. A photoelectric conversion device according to claim 6, wherein said one or more of polyacids are one or both of molybdic acid and tungstic acid.

8. A solar cell comprising said photoelectric conversion device according to claim 1.

9. A photoelectric conversion device according to claim 1, wherein the metal supply layer is provided between the lower electrode and anodized substrate.

* * * * *